(12) United States Patent
Huang

(10) Patent No.: US 11,830,837 B2
(45) Date of Patent: Nov. 28, 2023

(54) SEMICONDUCTOR PACKAGE WITH AIR GAP

(71) Applicant: NANYA TECHNOLOGY CORPORATION, New Taipei (TW)

(72) Inventor: Tse-Yao Huang, Taipei (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 84 days.

(21) Appl. No.: 17/524,928

(22) Filed: Nov. 12, 2021

(65) Prior Publication Data

US 2022/0077091 A1     Mar. 10, 2022

Related U.S. Application Data

(62) Division of application No. 16/864,767, filed on May 1, 2020, now Pat. No. 11,302,662.

(51) Int. Cl.
*H01L 23/00* (2006.01)
*H01L 23/31* (2006.01)
*H01L 25/065* (2023.01)

(52) U.S. Cl.
CPC .......... *H01L 24/08* (2013.01); *H01L 23/3171* (2013.01); *H01L 24/03* (2013.01); *H01L 24/89* (2013.01); *H01L 25/0657* (2013.01); *H01L 2224/0391* (2013.01); *H01L 2224/03622* (2013.01); *H01L 2224/03848* (2013.01); *H01L 2224/0807* (2013.01); *H01L 2224/08148* (2013.01); *H01L 2224/80001* (2013.01)

(58) Field of Classification Search
CPC ................. H01L 25/0657; H01L 25/50; H01L 2924/30105; H01L 24/03–05; H01L 24/80; H01L 23/53295
See application file for complete search history.

(56) References Cited

U.S. PATENT DOCUMENTS

| | | | |
|---|---|---|---|
| 2007/0040186 A1* | 2/2007 | Fillion | H01L 25/072 438/117 |
| 2008/0157327 A1* | 7/2008 | Yang | H01L 25/105 257/E23.18 |
| 2018/0342475 A1* | 11/2018 | Wirz | H01L 24/03 |
| 2021/0013189 A1* | 1/2021 | Kim | H01L 25/105 |
| 2021/0343654 A1* | 11/2021 | Huang | H01L 24/03 |

* cited by examiner

*Primary Examiner* — Hoa B Trinh
(74) *Attorney, Agent, or Firm* — Xuan Zhang

(57) ABSTRACT

The present application provides a semiconductor package with air gaps for reducing capacitive coupling between conductive features and a method for manufacturing the semiconductor package. The semiconductor package includes a first semiconductor structure and a second semiconductor structure bonded with the first semiconductor structure. The first semiconductor structure has a first bonding surface. The second semiconductor structure has a second bonding surface partially in contact with the first bonding surface. A portion of the first bonding surface is separated from a portion of the second bonding surface, a space between the portions of the first and second bonding surfaces is sealed and forms an air gap in the semiconductor package.

6 Claims, 22 Drawing Sheets

SEMICONDUCTOR PACKAGE WITH AIR GAP

CROSS-REFERENCE TO RELATED APPLICATION

This application is a divisional application of U.S. Non-Provisional application Ser. No. 16/864,767 filed May 1, 2020, which is incorporated herein by reference in its entirety.

TECHNICAL FIELD

The present disclosure relates to a semiconductor package, and more particularly, to a semiconductor package with air gaps for reducing capacitive coupling between conductive features.

DISCUSSION OF THE BACKGROUND

In recent years, the semiconductor industry has experienced rapid growth due to continuous improvement in integration density of various electronic components. These continuously scaled electronic components require smaller packages that occupy less area than previous packages. However, there are physical limitations to the scaling of semiconductor packages that can be achieved in two dimensions (2D). While 2D scaling remains an option for new designs, adopting three-dimensional (3D) packaging schemes that utilize the z-direction has become a focus of research in the industry. Nevertheless, there are still challenges to be handled for the 3D packaging technology.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In an aspect of the present disclosure, a semiconductor package is provided. The semiconductor package comprises: a first semiconductor structure, having a first surface and first recesses recessed from the first surface; and a second semiconductor structure, having a second surface and second recesses recessed from the second surface, wherein the first and second semiconductor structures are bonded with each other, the first surface is in contact with the second surface, each of the first recesses and one of the second recesses are overlapped with each other, and combine to form an air gap sealed in the semiconductor package.

In some embodiments, the first semiconductor structure comprises first conductive structures having surfaces substantially coplanar with the first surface, the second semiconductor structure comprises second conductive structures having surfaces substantially coplanar with the second surface, and the first conductive structures are in contact with the second conductive structures, respectively.

The semiconductor package according to claim 2, wherein one of the air gaps is located between adjacent ones of the first conductive structures, and between adjacent ones of the second conductive structures.

In some embodiments, the first recesses are substantially identical with the second recesses in terms of shape and dimension.

In some embodiments, the first surface is a surface of a first insulating structure, the first recesses are recessed into the first insulating structure, the second surface is a surface of a second insulating structure, and the second recesses are recessed into the second insulating structure.

In some embodiments, the first semiconductor structure comprises first passivation layers conformally covering surfaces of the first recesses, and the second semiconductor structure comprises second passivation layers conformally covering surfaces of the second recesses.

In some embodiments, the air gaps are respectively enclosed by one of the first passivation layers and one of the second passivation layers.

In another aspect of the present disclosure, a semiconductor package is provided. The semiconductor package comprises: a first semiconductor structure, having a first bonding surface; a second semiconductor structure, having a second bonding surface, and bonded to the first semiconductor structure, wherein the first bonding surface is partially in contact with the second bonding surface, a portion of the first bonding surface is separated from a portion of the second bonding surface, a space between the portions of the first and second bonding surfaces is sealed and forms an air gap in the semiconductor package.

In some embodiments, the first bonding surface has a first recess portion, the second bonding surface has a second recess portion, the first recess portion and the second recess portion combine to form the air gap.

In some embodiments, the first recess portion and the second recess portion are substantially identical with each other in terms of shape and dimension.

In yet another aspect of the present disclosure, a method for manufacturing a semiconductor package is provided. The method comprises: providing a substrate with an integrated circuit; forming a first stack of insulating layers with bonding structures and supporting structures on the integrated circuit; forming a mask pattern on the first stack of insulating layers; removing some portions of the first stack of insulating layers to form first recesses in a top region of the first stack of insulating layers; forming a passivation layer conformally covering the first recesses and a top surface of the first stack of insulating layers; removing portions of the passivation layer above the top surface of the first stack of insulating layers, to form a first semiconductor structure; providing a second semiconductor structure having a second stack of insulating layers with second recesses; and bonding the first semiconductor structure with the second semiconductor structure, with air gaps formed from the first recesses and the second recesses.

In some embodiments, the first recesses and the second recesses are overlapped with each other, and combine to form the air gaps sealed in the semiconductor package.

In some embodiments, the first semiconductor structure comprises first conductive structures having surfaces substantially coplanar with the top surface of the first stack, the second semiconductor structure comprises second conductive structures (having surfaces substantially coplanar with a top surface of the second stack, and the first conductive structures are in contact with the second conductive structures to form a conductive wire for transmitting signals.

In some embodiments, one of the air gaps is located between adjacent ones of the first conductive structures, and between adjacent ones of the second conductive structures.

In some embodiments, the first recesses are substantially identical with the second recesses in terms of shape and dimension.

In some embodiments, the second semiconductor structure comprises a second passivation layer conformally covering the second recesses and a top surface of the second stack of insulating layers.

In some embodiments, the air gaps are respectively enclosed by the first passivation layer and the second passivation layer.

The method for manufacturing a semiconductor package according to claim 16, wherein one of the air gaps is located between one of the first conductive structures and one of the second conductive structures.

In some embodiments, the method for manufacturing a semiconductor package according further comprises: performing an ultraviolet (UV) curing process to remove dangling bonds, before bonding the first semiconductor structure with the second semiconductor structure.

In some embodiments, the method for manufacturing a semiconductor package according further comprises: performing a rapid thermal nitridation to densify the passivation layer.

In conclusion, the semiconductor package according to embodiments of the present disclosure includes two semiconductor structures bonded with each other, and includes air gaps sealed at an interface between the semiconductor structures. Some of the air gaps are located between conductive components configured to establish electrical connection between the semiconductor structures. Because of a low dielectric constant of air, a capacitive coupling between these conductive components can be reduced by disposing the air gaps in between. Consequently, RC delay of the conductive components can be lowered. Therefore, signal transmission between the semiconductor structures can be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
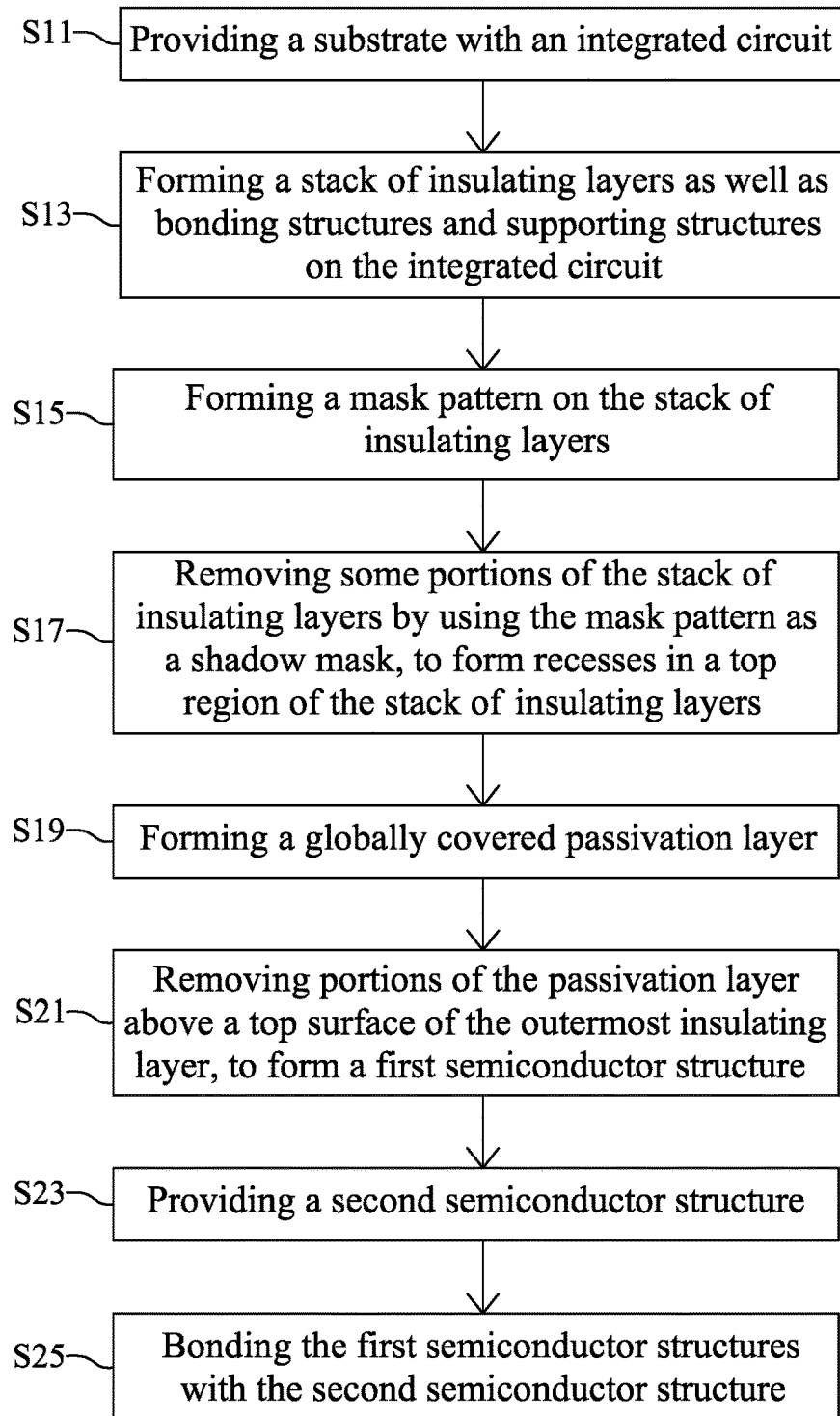
FIG. 1 is a flow diagram illustrating a manufacturing method of a semiconductor structure according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2A:
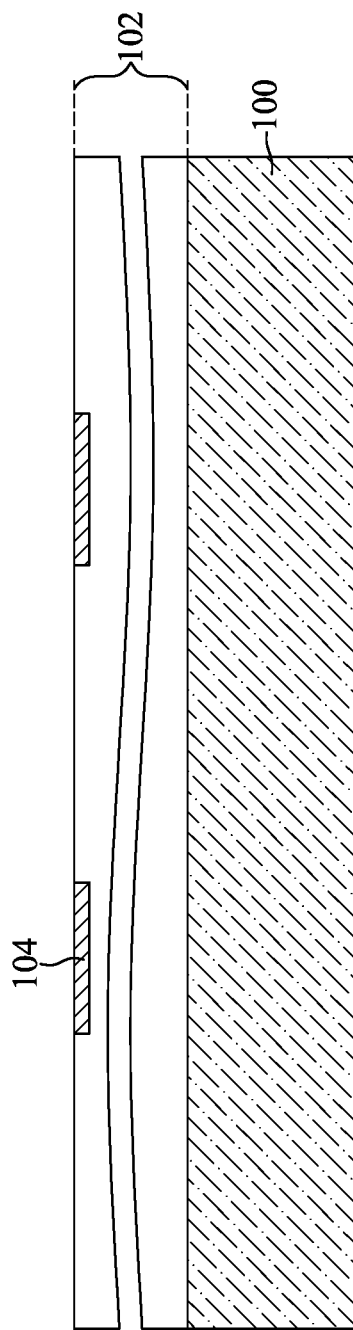
FIG. 2A through FIG. 2I are schematic cross-sectional views illustrating structures at various stages during the manufacturing process as shown in FIG. 1.

FIG. 1 is a flow diagram illustrating a manufacturing method M30 of a semiconductor structure according to some embodiments of the present disclosure. FIG. 2A through FIG. are schematic cross-sectional views illustrating intermediate structures at various stages during the manufacturing process as shown in FIG. 1.

Referring to FIG. 1 and FIG. 2A, step S11 is performed, and a substrate 100 with an integrated circuit 102 is provided. In some embodiments, the substrate 100 is in a wafer form. In these embodiments, the substrate 100 may be a semiconductor wafer or a semiconductor-on-insulator (SOI) wafer. For instance, a semiconductor material in the semiconductor wafer or the SOI wafer may include an elemental semiconductor (e.g. Si), an alloy semiconductor (e.g., SiGe), a compound semiconductor (e.g., a group 3-5 semiconductor, a group 2-6 semiconductor) or combinations thereof. In addition, the semiconductor material may be doped with a first conductive type (e.g. N type) or a second conductive type (e.g. P type) complementary to the first conductive type. In those embodiments where the substrate 100 is in a wafer form, the substrate 100 may have die regions separated from one another by a scribe line region (both not shown), and the integrated circuit 102 spreads within the die regions. The integrated circuit 102 may include active devices and/or passive devices (both not shown) formed at a surface of the substrate 100, and may include interconnections (also not shown) over the active devices and/or passive devices. The interconnections are configured to interconnect the active devices and/or the passive devices, and to rout the active devices and/or the passive devices to a top side of the integrated circuit 102. For instance, the active devices may include metal-oxide-semiconductor field effect transistors (MOSFETs), and the passive devices may include capacitors. In addition, the interconnections may be formed in a stack of dielectric layers, and may include conductive traces respectively extending on a surface of one of the dielectric layers and conductive vias extending vertically and connected to at least one of the conductive traces. It should be noted that, only the topmost portions of the interconnections are depicted in FIG. 2A, and are labeled as interconnections 104. In addition, a top side of the integrated circuit 102 may be referred as an active side of the eventually formed semiconductor structure (e.g., the semiconductor structure 10 as shown in FIG. 2F), while a bottom side of the substrate 100 may be referred as a back side of the semiconductor structure.

Figure 2B:
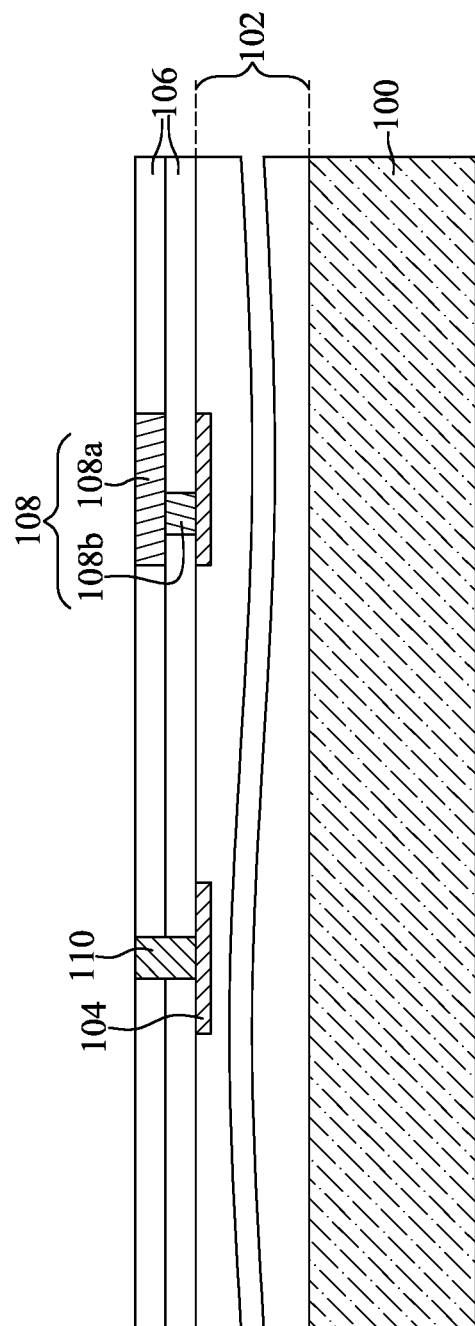

Referring to FIG. 1 and FIG. 2B, step S13 is performed, and a stack of insulating layers 106 (e.g., two insulating layers 106) as well as bonding structures 108 and supporting structures 110 are formed on the integrated circuit 102. The bonding structures 108 and the supporting structures 110 penetrate through the stack of insulating layers 106. It should be noted that, only one of the bonding structures 108 and one of the supporting structures 110 are depicted. The bonding structures 108 are electrically connected to the topmost portions of the interconnections (i.e., the interconnections 104), and may be functioned as inputs/outputs (I/Os) of the integrated circuit 102. In some embodiments, the bonding structures 108 respectively include a bonding pad 108a and a routing structure 108b connecting the bonding pad 108a to the topmost portions of the interconnections (i.e., the interconnections 104). The bonding pad 108a may be formed in the topmost insulating layer 106, and has a top surface substantially coplanar with a top surface of the topmost insulating layer 106. The routing structure 108b, such as a conductive via or a conductive pillar, extends from a bottom end of the bonding pad 108a to the topmost portions of the interconnections (i.e., the interconnections 104). On the other hand, the supporting structures 110 may be formed as conductive vias or conductive pillars, and extend through the stack of insulating layers 106. In some embodiments, the supporting structures 110 may be electrically connected to the topmost portions of the interconnections (i.e., the interconnections 104). In these embodiments, the connected interconnections 104 and the supporting structures 110 may be electrically floated, and are configured to enhance mechanical strength of the eventually formed semiconductor structure (e.g., the semiconductor package 30 as shown in FIG. 2H). Alternatively, the connected interconnections 104 and the supporting structures 110 may be electrically grounded, and may be functioned as electromagnetic shields for the integrated circuit 102. In other embodiments, the supporting structures 110 may not be electrically connected to any of the interconnections 104, and may be electrically floated or electrically grounded.

Moreover, in some embodiments, the supporting structures 110 may be connected to one another to form a wall, and this wall laterally surrounds the bonding structures 108. In these embodiments, the wall may be functioned as a seal ring. In alternative embodiments, the supporting structures 110 are laterally separated from one another, and are laterally surrounded by a seal ring (not shown), along with the bonding structures 108.

A material of the insulating layers 106 may include an inorganic insulating material (e.g., silicon oxide, silicon nitride, silicon oxynitride, the like or combinations thereof), while the bonding structures 108 and the supporting structures 110 may be made of a conductive material, such as a metal or a metal alloy (e.g., copper, copper alloy, the like or combinations thereof). In some embodiments, a method for forming each insulating layer 106 may include a deposition process (e.g., a chemical vapor deposition (CVD) process), while a method for forming the bonding structures 108 and the supporting structures 110 in the stack of insulating layers 106 may include at least one damascene process. However, those skilled in the art may select other viable materials and/or other appropriate formation methods for forming the insulating layers 106, the bonding structures 108 and the supporting structures 110, the present disclosure is not limited thereto.

In some embodiments, the conductive material in the bonding structures 108 and the supporting structures 110 is separated from the stack of insulating layers 106 by a barrier layer (not shown). A material of the barrier layers (referred as a barrier material hereinafter) may include Ti, TiN, Ta, TaN, the like or combinations thereof. In addition, a method for forming the barrier layer may include a deposition process, such as a physical vapor deposition (PVD) process or an atomic layer deposition (ALD) process.

Figure 2C:
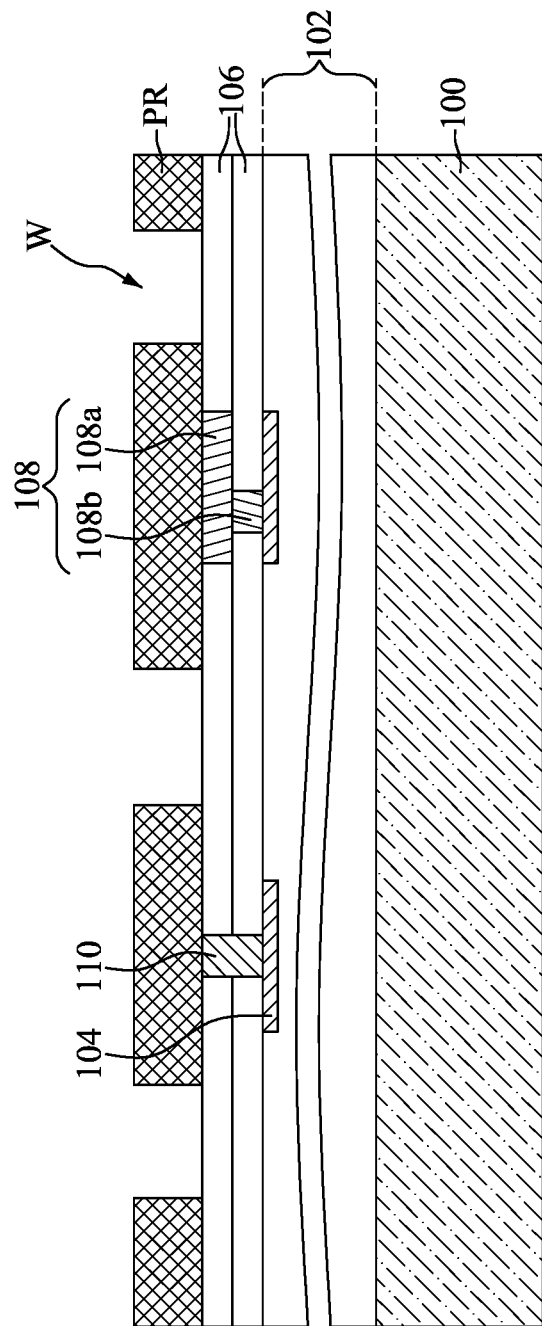
Figure 2D:
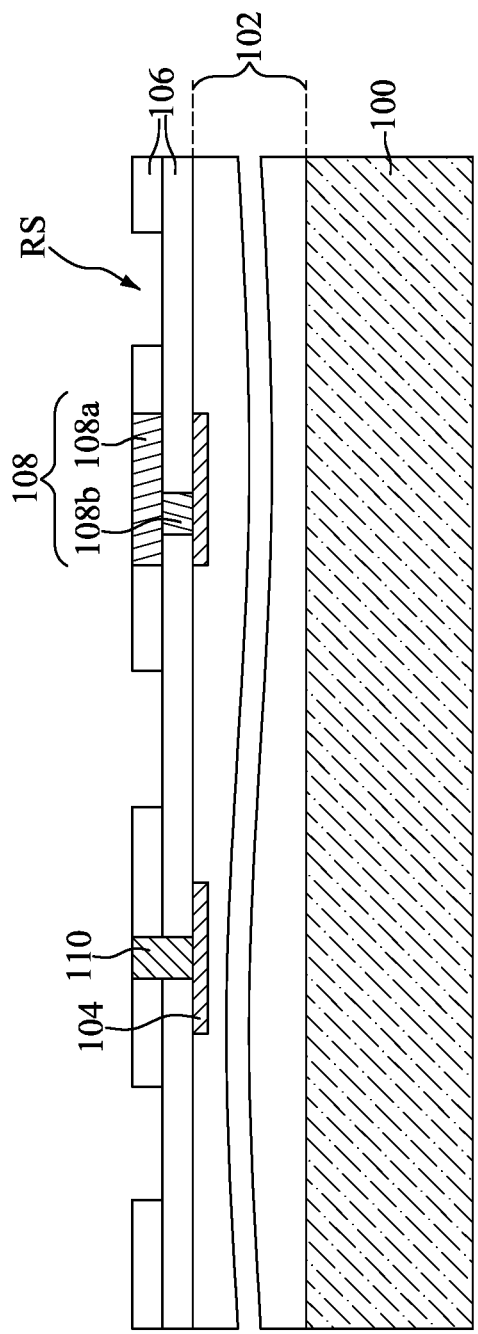

Referring to FIG. 1 and FIG. 2C, step S15 is performed, and a mask pattern PR is formed on the stack of insulating layers 106. The mask pattern PR, such as a photoresist pattern, has openings W defining locations of the recesses to be formed in the stack of insulating layers 106 during the following step (e.g., the recesses RS as shown in FIG. 2D). The openings W are each laterally spaced apart from the bonding structures 108 and the supporting structures 110. Some of the openings W are respectively located between one of the bonding structures 108 and one of the supporting structures 110, between adjacent ones of the bonding structures 108, or between adjacent ones of the supporting structures 110. In addition, some others of the openings W may be located outside the distribution range of the bonding structures 108 and the supporting structures 110. In those embodiments where the mask pattern PR is a photoresist pattern, a method for forming the mask pattern PR may include a coating process and a lithography process.

Referring to FIG. 1 and FIG. 2D, step S17 is performed, and some portions of the stack of insulating layers 106 are removed by using the mask pattern PR as a shadow mask, in order to form recesses RS in a top region of the stack of insulating layers 106. In some embodiments, the portions of the stack of insulating layers 106 overlapped with the openings W of the mask pattern PR are removed to form the recesses RS by an etching process, such as an anisotropic etching process. As the same as the openings W of the mask pattern PR, the recesses RS are each laterally spaced apart from the bonding structures 108 and the supporting structures 110. Some of the recesses RS are respectively located between one of the bonding structures 108 and one of the supporting structures 110. In addition, some others of the recesses RS may be located outside the distribution range of the bonding structures 108 and the supporting structures 110. In some embodiments, portions of the outermost insulating layer 106 overlapped with the openings W are removed, while the insulating layer(s) 106 lying under the outermost insulating layer 106 may substantially remain complete. In these embodiments, an etching stop layer (not shown) may be disposed between two vertically adjacent insulating layers 106 during the step S13 as described with reference to FIG. 2B, and has sufficient etching selectivity with respect to these insulating layers 106. In this way, portions of the etching stop layer overlapped with the openings W may be exposed after the formation of the recesses RS, and may define bottom surfaces of the recesses RS. Alternatively, the etching stop layer may be omitted, and the insulating layer(s) 106 lying under the outermost insulating layer 106 may or may not be partially removed during the etching process.

Figure 2E:
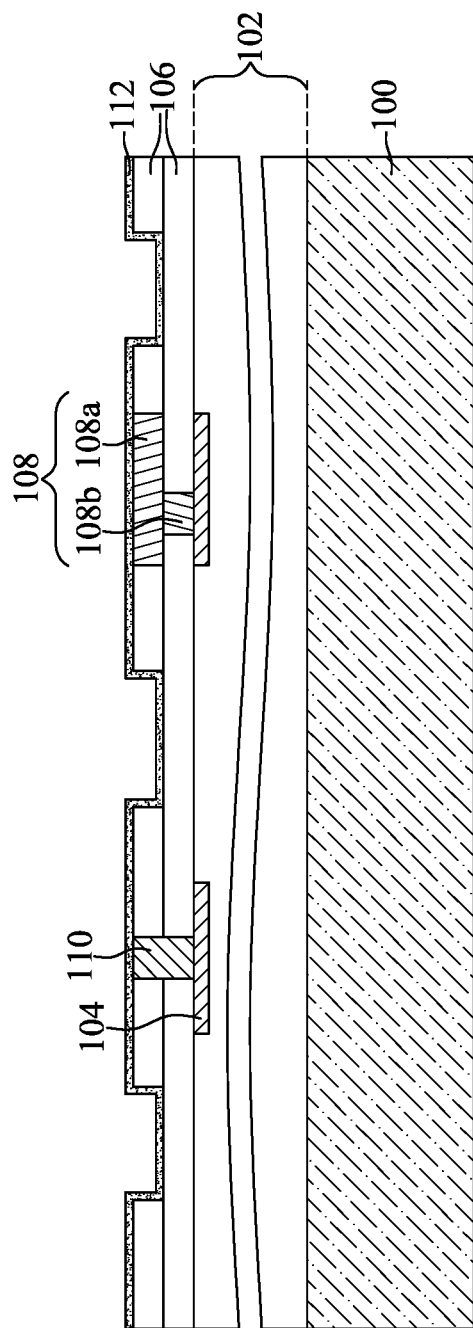
Figure 2F:
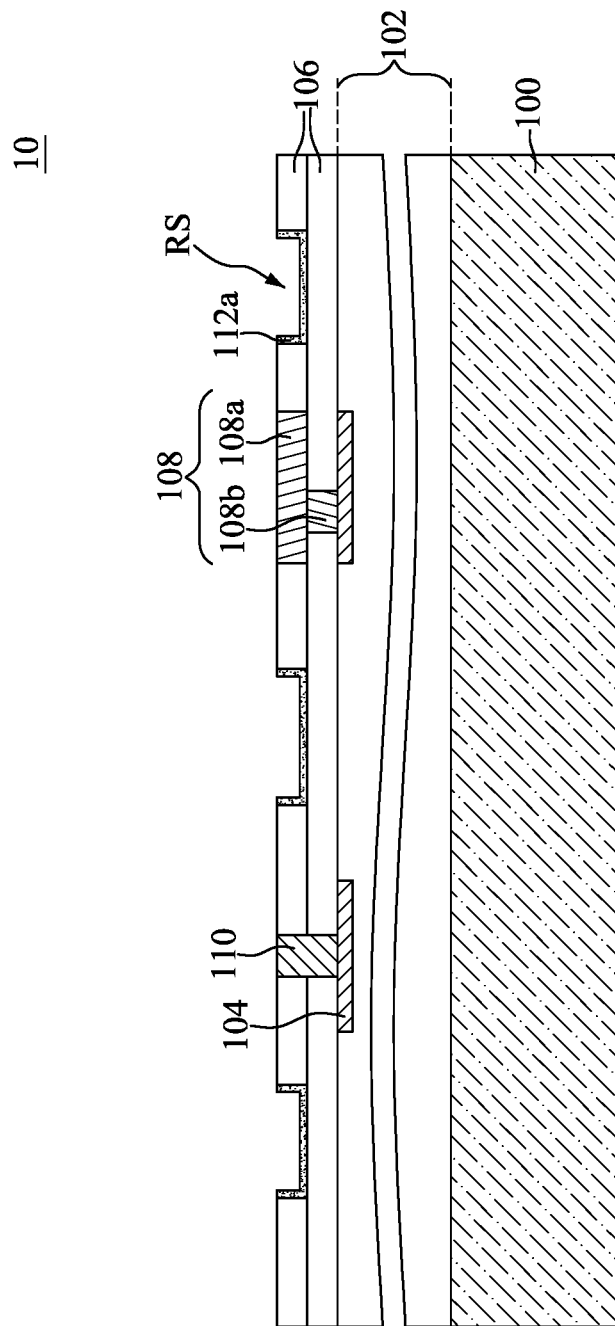

Referring to FIG. 1 and FIG. 2E, step S19 is performed, and a passivation layer 112 is globally formed. As a result, top surfaces of the stack of insulating layers 106, the bonding structures 108 and the supporting structures 110 are covered by the passivation layer 112. In some embodiments, the passivation layer 112 conformally covers the underlying structure. In these embodiments, the recesses RS may not be filled up by the passivation layer 112, and the passivation layer 112 is recessed in corresponding to the recesses RS in the top region of the stack of insulating layers 106. A material of the passivation layer 112 may, for example, include silicon nitride. In addition, a method for forming the passivation layer 112 may include a deposition process, such as an atomic layer deposition (ALD) process. However, those skilled in the art may select other viable insulating material and/or other suitable formation method for forming the passivation layer 112, the present disclosure is not limited thereto.

Referring to FIG. 1 and FIG. 2F, step S21 is performed, and portions of the passivation layer 112 above a top surface of the outermost insulating layer 106 are removed. As a result, only portions of the passivation layer 112 in the recesses RS are remained, and each referred as a passivation layer 112a. In addition, the top surface of the outermost insulating layer 106 as well as top surfaces of the bonding structures 108 and the supporting structures 110 are exposed. In some embodiments, a method for removing the portions of the passivation layer 112 may include a planarization process. For instance, the planarization process may include a chemical mechanical polishing (CMP) process, an etching process or a combination thereof.

In some embodiments, the passivation layers 112a are composed of silicon nitride, and a rapid thermal nitridation (RTN) process is performed after the step S21. By performing the RTN process, the silicon nitride in the passivation layers 112 may be further densified. In alternative embodiments, the passivation layers 112a may be made of silicon oxide, and the silicon oxide may turn into silicon oxynitride or silicon nitride after subjecting to the RTN process. Moreover, in some embodiments, an ultraviolet (UV) curing process may be performed to remove dangling bonds in conductive components (e.g., the bonding structures 108, the supporting structures 110 and the interconnections of the integrated circuit 102). In these embodiments, the UV curing process may follow the RTN process, but the present disclosure is not limited thereto.

Figure 2G:
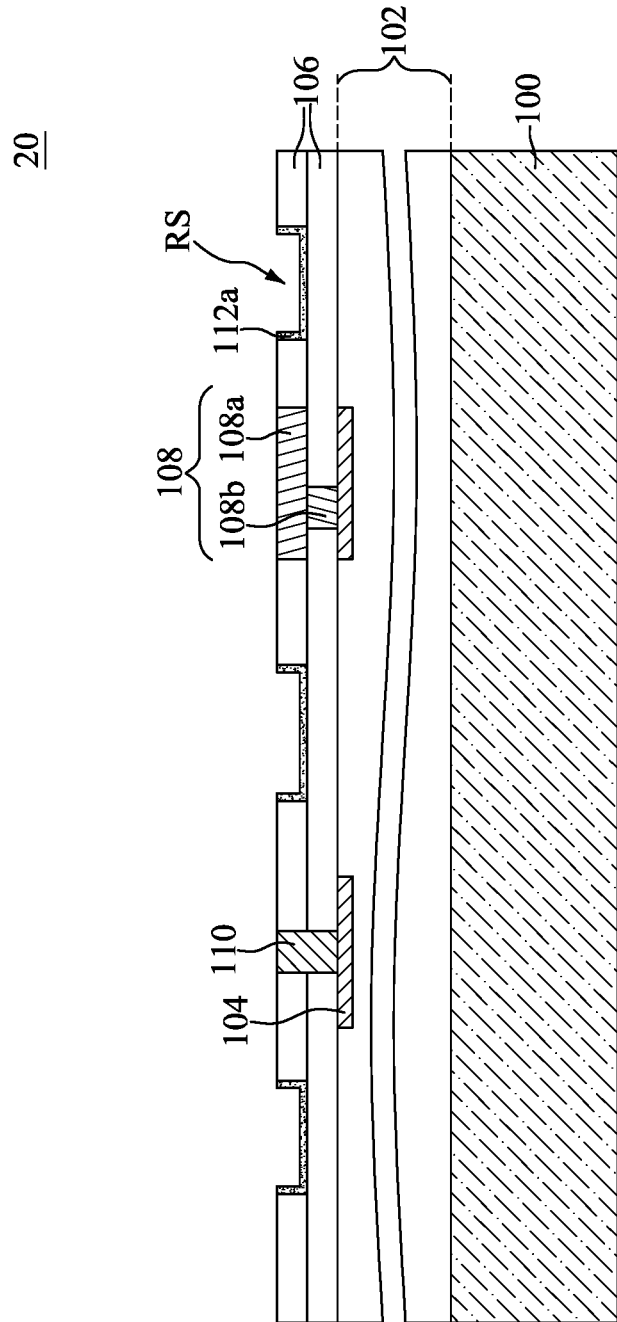
Figure 2H:
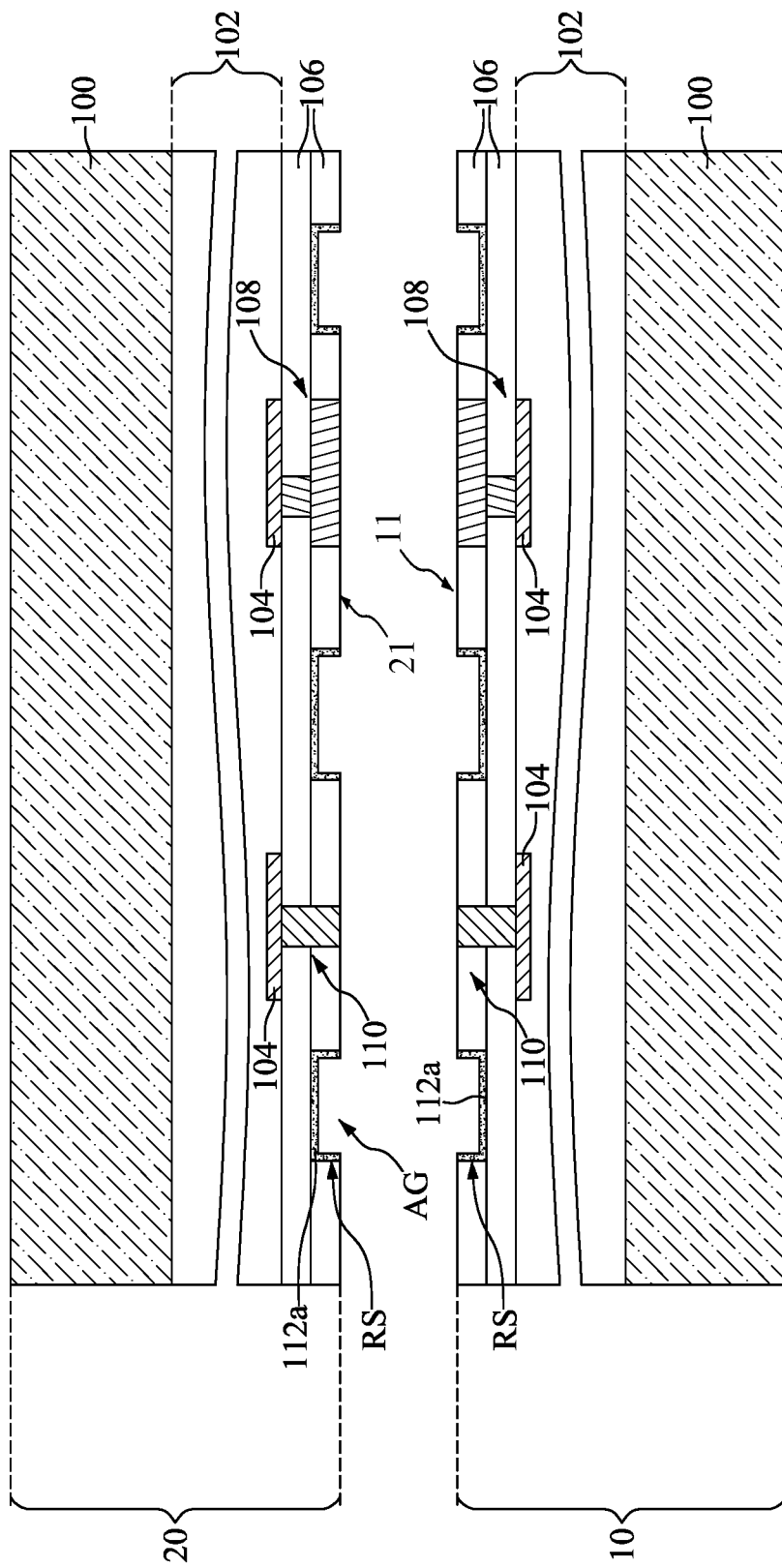

Up to here, a semiconductor structure 10 is formed. The semiconductor structure 10 is to be bonded with another semiconductor structure (e.g., the semiconductor structure 20 as shown in FIG. 2G), and exposed surfaces of the outermost insulating layer 106, the passivation layers 112a, the bonding structures 108 and the supporting structures 110 may collectively define a bonding surface 11 of the semiconductor structure 10. At least some portions of the bonding surface (e.g., the surfaces of the passivation layers 112a in the recesses RS) may not be in contact with the subsequently bonded semiconductor structure (e.g., the semiconductor structure 20 as shown in FIG. 2G). In some embodiments, the semiconductor structure 10 stays in a wafer form. In alternative embodiments, a singulation process may be performed on the structure shown in FIG. 2F, such that the semiconductor structure 10, which may be one of the singulated structures, is in a chip form.

Referring to FIG. 1 and FIG. 2G, step S23 is performed, and a semiconductor structure 20 is provided. In some embodiments, the semiconductor structure 20 is provided by a method describe with reference to FIG. 2A through FIG. 2F. In order to avoid repeated descriptions, components in the semiconductor structures 10, 20 are labeled identically. As similar to the semiconductor structure 10, the semiconductor structure 20 may stay in a wafer form. Alternatively, a singulation process may be further performed, and the semiconductor structure 20, which may be one of the singulated structures, is in a chip form. The semiconductor structure 20 is to be bonded onto the semiconductor structure 10, and exposed surfaces of the outermost insulating layer 106, the passivation layers 112a, the bonding structures 108 and the supporting structures 110 may collectively define a bonding surface 21 of the semiconductor structure 20. At least some portions of the bonding surface (e.g., the surfaces of the passivation layers 112a in the recesses RS) may not participate in bonding of the semiconductor structures 10, 20.

Figure 2I:
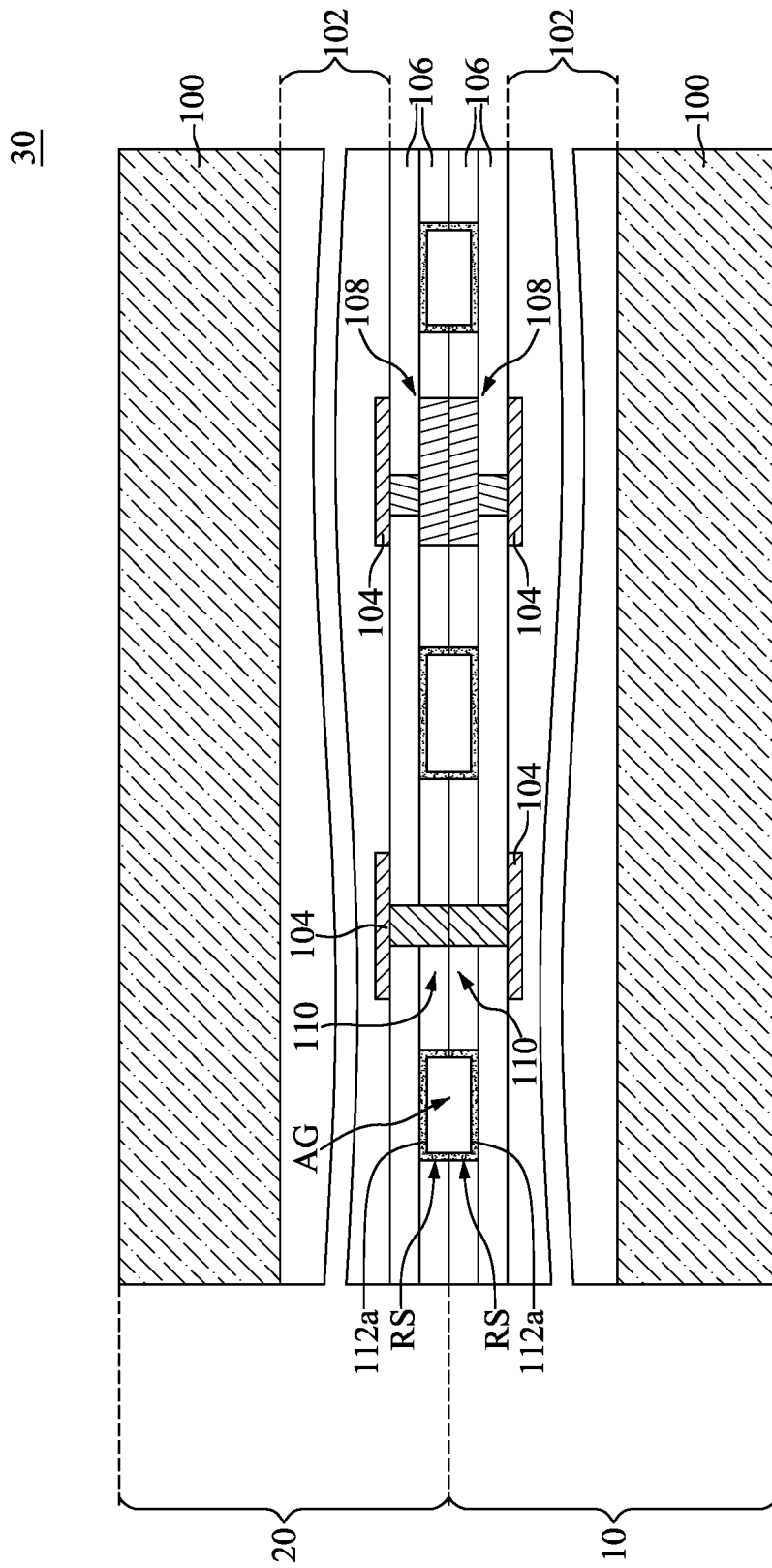

Referring to FIG. 1 and FIGS. 2I1-2I, step S25 is performed, and the semiconductor structures 10, 20 are bonded with each other to form a semiconductor package 30. Regarding the semiconductor structures 10, 20 may respectively be in a wafer form or a chip form, the semiconductor package 30 may be a wafer-on-wafer structure, a chip-on-wafer structure or a chip-on-chip structure. Once the semiconductor structures 10, 20 are bonded together, the bonding surfaces of the semiconductor structures 10, 20 are partially in contact with each other. In some embodiments, the outermost insulating layers 106 of the semiconductor structures 10, 20 are bonded with each other, and the stack of insulating layers 106 of the semiconductor structure 10 and the stack of insulating layers 106 of the semiconductor structure 20 are connected to form a combined stack of insulating layers 106. In addition, the bonding structures 108 of the semiconductor structures 10, 20 are bonded with each other, and an electrical connection between the integrated circuits 102 of the semiconductor structures 10, 20 is established. Moreover, the supporting structures 110 from the semiconductor structures 10, 20 are bonded with each other, and may be electrically floated or electrically grounded. On the other hand, the recesses RS of the semiconductor structures 10, 20 are aligned with each other, such that vertically extending portions of the passivation layers 112a of the semiconductor structure 10 are bonded with vertically extending portions of the passivation layers 112a of the semiconductor structure 20. Accordingly, cavities in the recesses RS can be sealed by the passivation layers 112a of the semiconductor structures 10, 20, and form air gaps AG in the bonded structure (i.e., the semiconductor package 30). The air gaps AG are respectively enclosed by two of the passivation layers 112a that are bonded with each other. The bonding structures 108, the supporting structures 110, the passivation layers 112a and the air gaps AG are located in the combined stack of insulating layers 106. As inherit from the recesses RS, some of the air gaps AG are located within a distribution range of the bonding structures 108 and the supporting structures 110, while some others of the air gaps AG are located outside the distribution range of the bonding structures 108 and the supporting structures 110.

In some embodiments, a method for bonding the semiconductor structures 10, 20 includes placing one of the semiconductor structures 10, 20 on the other by, for example, a pick and place (PNP) process, and performing a hybrid bonding process to establish a physical bonding between the semiconductor structures 10, 20. In some embodiments, the hybrid bonding process is performed in a vacuum atmosphere or an inert atmosphere, so as to prevent oxidation of conductive components and/or moisture intrusion. The hybrid bonding process may include a first heating step for bonding insulating components, and a second heating step for bonding the conductive components. For instance, the insulating components may include the attached insulating layers 106 and passivation layers 112a, while the conductive components may include the attached bonding structures 108 and supporting structures 110. In some embodiments, the first heating step precedes the second heating step. In addition, in some embodiments, a heating temperature of the first heating step is lower than a heating temperature of the second heating step. For instance, the heating temperature of the first heating step may range from 150° C. to 250° C., while the heating temperature of the second heating step may range from 180° C. to 350° C. However, those skilled in the art may adjust the sequential order and the heating temperatures of the first and second heating steps according to process requirements, the present disclosure is not limited thereto.

Because of a low dielectric constant of air (e.g., about 1), a capacitive coupling between laterally adjacent bonding structures 108 can be reduced by disposing the air gaps AG. Similarly, a capacitive coupling between the bonding structures 108 and the supporting structures 110 can be reduced because of the air gaps AG. Consequently, resistive-capacitive delay (RC delay) of the bonding structures 108 can be lowered. Therefore, signal transmission between the integrated circuits 102 of the semiconductor structures 10, 20 can be improved.

Figure 3:
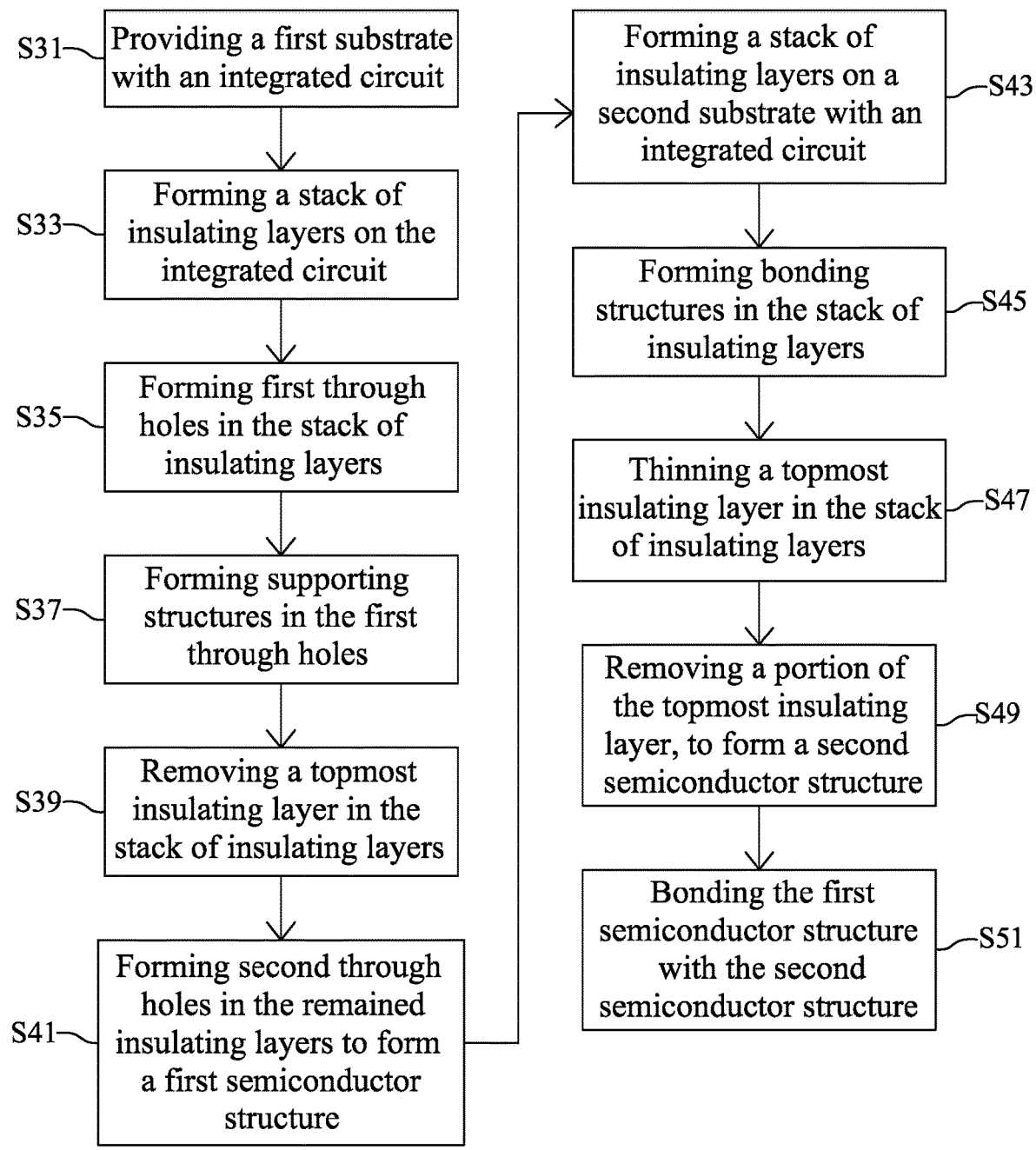
FIG. 3 is a flow diagram illustrating a manufacturing method of a semiconductor structure according to some embodiments of the present disclosure.

FIG. 3 is a flow diagram illustrating a manufacturing method M60 of a semiconductor structure according to some embodiments of the present disclosure. FIG. 4A through FIG. 4K are schematic cross-sectional views illustrating structures at various stages during the manufacturing process as shown in FIG. 3. The embodiments to be described with reference to FIG. 3 and FIG. 4A through FIG. 4K are similar to the embodiments describe with reference to FIG. 1 and FIG. 2A through FIG. 2I, and only differences therebetween will be discussed, the same or the like parts would not be repeated again. In addition, the like labels are referred to similar or identical components (e.g., the substrate 100 and the substrate 200).

Figure 4A:
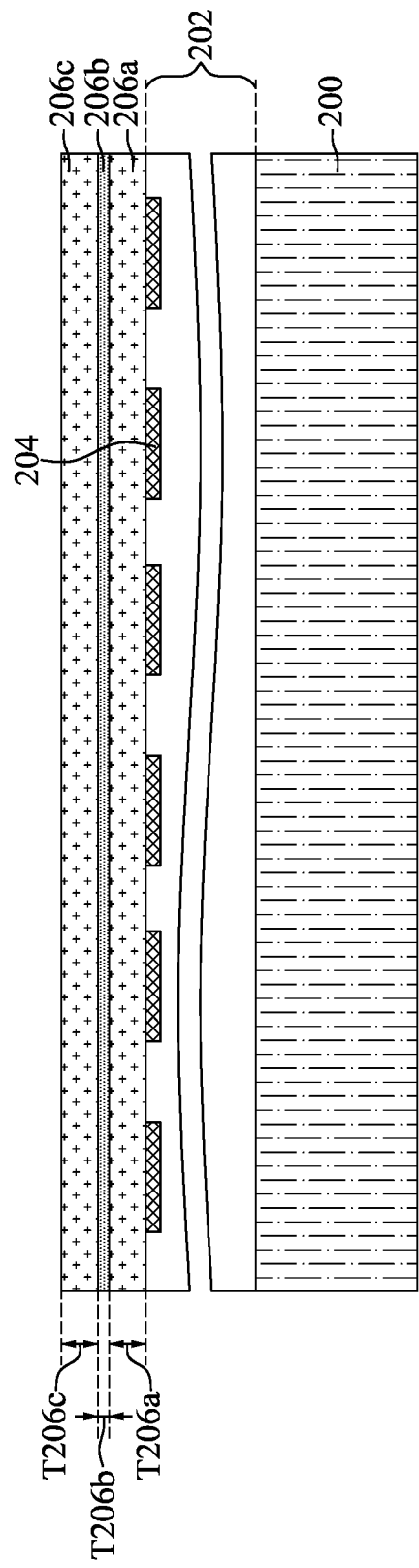
FIG. 4A through FIG. 4K are schematic cross-sectional views illustrating structures at various stages during the manufacturing process as shown in FIG. 3.

Referring to FIG. 3 and FIG. 4A, step S31 is performed, and a substrate 200 formed with an integrated circuit 202 is provided. It should be noted that, only topmost portions of interconnections in the integrated circuit 202 are depicted and labeled as interconnections 204.

Subsequently, step S33 is performed, and insulating layers 206a, 206b, 206c are formed on the integrated circuit 202. The insulating layer 206a lies under the insulating layers 206b, 206c, and the insulating layer 206b is sandwiched between the insulating layers 206a, 206c. The insulating layer 206a has a thickness $T_{206a}$, the insulating layer 206b has a thickness $T_{206b}$, and the insulating layer 206c has a thickness $T_{206c}$. In some embodiments, the thickness $T_{206b}$ is less than the thickness $T_{206a}$ and the thickness $T_{206c}$, and the thickness $T_{206a}$ may be greater than, equal to or less than the thickness $T_{206c}$. In addition, in some embodiments, a material of the insulating layer 206b is different from a material of the insulating layers 206a, 206c. For instance, the insulating layer 206b may be composed of silicon nitride, while the insulating layers 206a, 206c may be composed of silicon oxide. A method for forming each of the insulating layers 206a, 206b, 206c may include a deposition process, such as a CVD process. However, those skilled in the art may adjust the thicknesses $T_{206a}$, $T_{206b}$, $T_{206c}$ of the insulating layers 206a, 206b, 206c and select other suitable materials and formation methods for forming the insulating layers 206a, 206b, 206c, the present disclosure is not limited thereto.

Figure 4B:
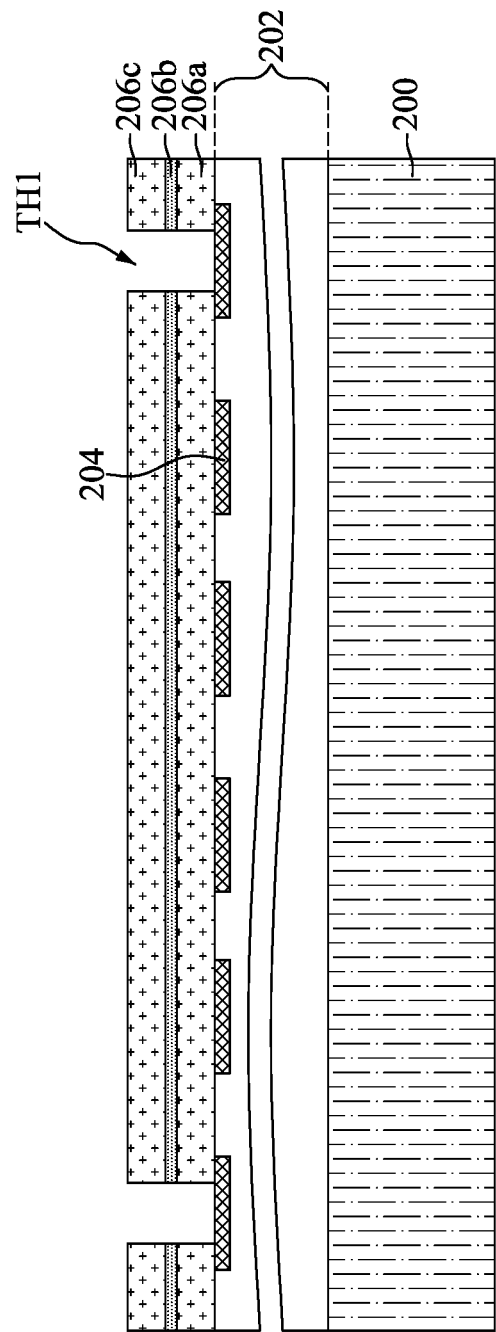

Referring to FIG. 3 and FIG. 4B, step S35 is performed, and through holes TH1 are formed in the insulating layers 206a, 206b, 206c. The through holes TH1 penetrate through the insulating layers 206a, 206, 206c, and expose some of the topmost portions of the interconnections (i.e., the interconnections 204). In some embodiments, the exposed interconnections 204 are located close to an edge of the die region (as described with reference to FIG. 2A). A method for forming the through holes TH1 may include performing a lithography process and one or more etching processes (e.g., anisotropic etching processes).

Figure 4C:
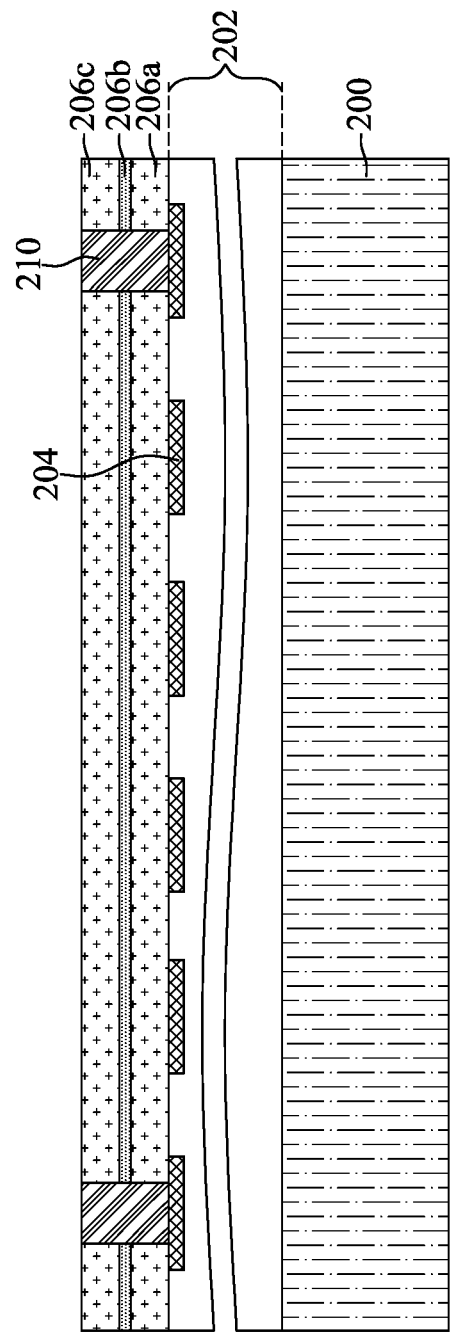

Referring to FIG. 3 and FIG. 4C, step S37 is performed, and supporting structures 210 are formed in the through holes TH1. The supporting structures 210 are in contact with the previously exposed interconnections 204. The connected supporting structures 210 and interconnections 204 are electrically floated or electrically grounded. In some embodiments, a method for forming the supporting structures 210 includes filling a conductive material into the through holes TH1 by a deposition process (e.g., a physical vapor deposition (PVD) process), a plating process (e.g., an electroplating process or an electro-less plating process) or a combination thereof. In addition, a planarization process may be performed to remove portions of the conductive material above a top surface of the insulating layer 206c. For instance, the conductive material may include a metal or a metal alloy (e.g., copper, copper alloy, the like or combinations thereof). In addition, the planarization process may include, for example, a CMP process, an etching process or a combination thereof.

In some embodiments, each of the supporting structures 210 further includes a barrier layer (not shown) covering a sidewall (or a sidewall and a bottom surface) of the conductive material in each through hole TH1. A material of the barrier layers (referred as a barrier material hereinafter) may include Ti, TiN, Ta, TaN, the like or combinations thereof. In addition, a method for forming the barrier layers may include filling the barrier material into the through holes TH1 by a deposition process, such as a PVD process or an ALD process. In some embodiments, portions of the barrier material above the top surface of the insulating layer 206c may be removed by the planarization process used for removing the portions of the conductive material above the top surface of the insulating layer 206c.

Figure 4D:
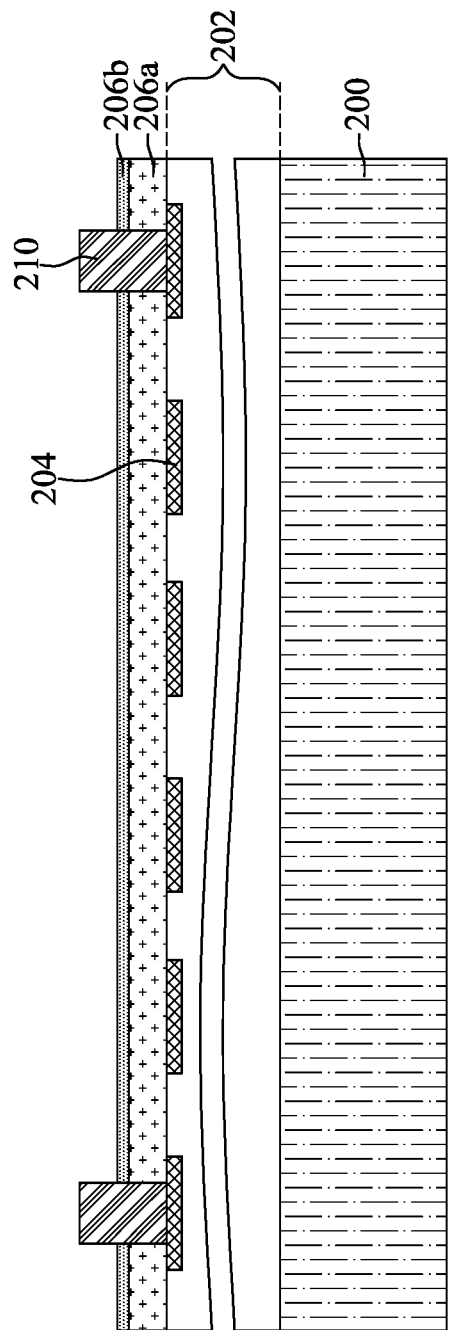

Referring to FIG. 3 and FIG. 4D, step S39 is performed, and the insulating layer 206c is removed. As the removal of the insulating layer 206c, a top surface of the insulating layer 206b and upper portions of sidewalls of the supporting structures 210 are exposed. In addition, the supporting structures 210 currently protrude from the top surface of the insulating layer 206b by a height substantially equal to the thickness of the removed insulating layer 206c (i.e., the thickness $T_{206c}$ as shown in FIG. 4A).

Figure 4E:
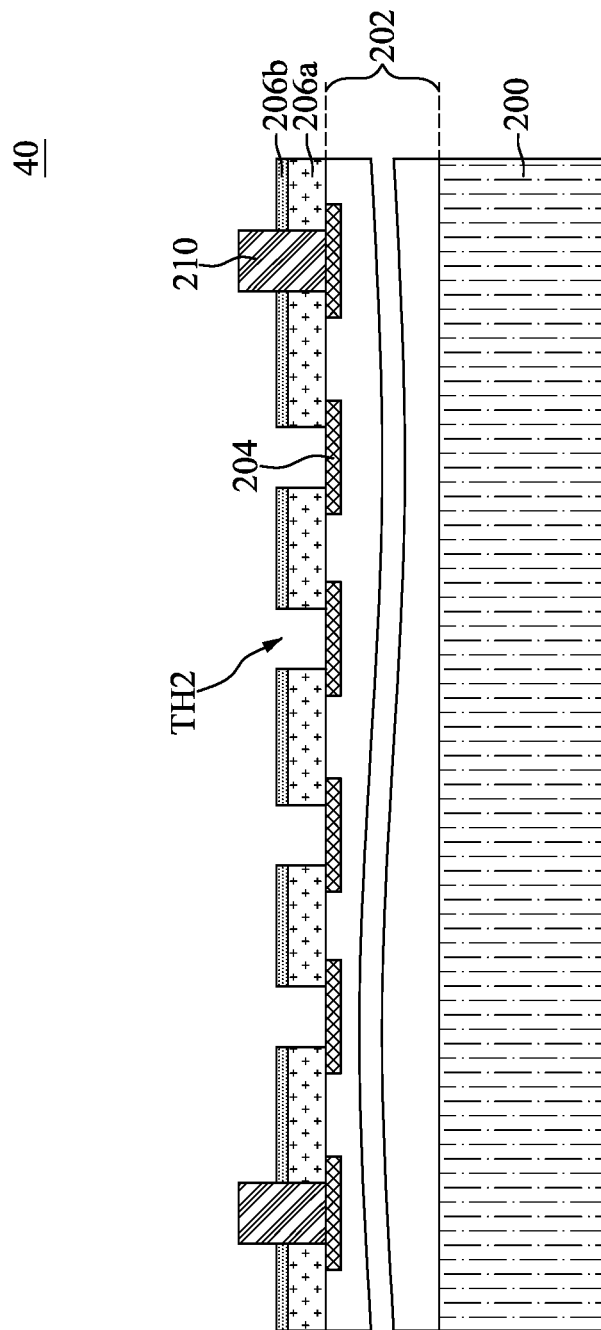

Referring to FIG. 3 and FIG. 4E, step S41 is performed, and through holes TH2 are formed in the insulating layers 206b, 206a. The through holes TH2 penetrate through the insulating layers 206b, 206a, and expose some of the topmost portions of the interconnection (i.e., the interconnections 204) that are previously covered by the insulating layer 206a. The through holes TH2 are configured to be inserted by conductive components of another semiconductor structure in the following steps (e.g., the bonding structures 308 of the semiconductor structure 50 as shown in FIG. 4J). In some embodiments, a method for forming the through holes TH2 includes a lithography process and at least one etching process.

Up to here, a semiconductor structure 40 has been formed. The semiconductor structure 40 may stay in a wafer form. Alternatively, a singulation process may be further performed, and the semiconductor structure 40, which may be one of the singulated structures, is in a chip form. In some embodiments, the semiconductor structure 40 may be flipper over and bonded onto another semiconductor structure (e.g., the semiconductor structure 50 as shown in FIG. 4J) in the following steps. The exposed surfaces of the insulating layers 206a, 206b, the interconnections 204 and the supporting structures 210 collectively define a bonding surface 41 of the semiconductor structure 40. At least some portion of the bonding surface may not in contact with the semiconductor structure bonded with the semiconductor structure 40.

Figure 4F:
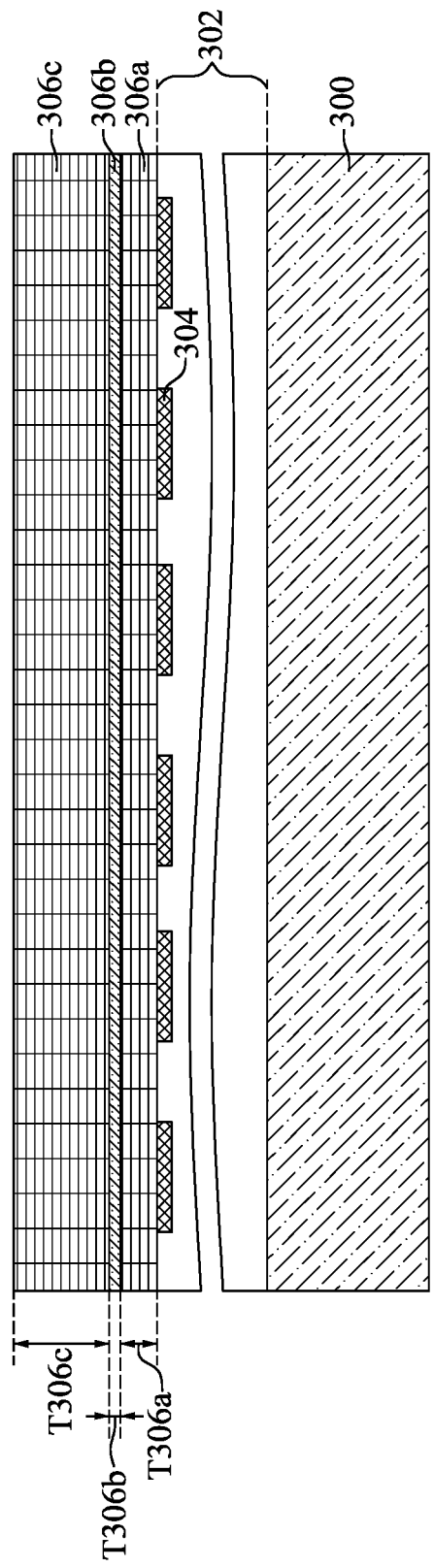

Referring to FIG. 3 and FIG. 4F, step S43 is performed, and insulating layers 306a, 306b, 306c are formed on a substrate 300 formed with an integrated circuit 302. The substrate 300 and the integrated circuit 302 are similar to the substrates 100, 200 and the integrated circuits 102, 202 as described with reference to FIG. 2A and FIG. 4A, and only topmost portions of the interconnections in the integrated circuit 302 are depicted and labeled as interconnections 304. In addition, the insulating layers 306a, 306b, 306c may be similar to the insulating layers 206a, 206b, 206c as described with reference to FIG. 4A in terms of materials and stacking order (i.e., the insulating layers 306a, 306b, 306c are sequentially stacked on the integrated circuit 302). In some embodiments, a total thickness of the insulating layers 306a, 306b, 306c is greater than a total thickness of the insulating layers 206a, 206b, 206c (as shown in FIG. 4A). In these embodiments, a thickness $T_{306c}$ of the insulating layer 306c may be greater than the thickness $T_{206c}$ of the insulating layer 206c (as shown in FIG. 4A). On the other hand, a thickness $T_{306b}$ of the insulating layer 306b may be substantially identical with the thickness $T_{206b}$ of the insulating layer 206b (as shown in FIG. 4A), and a thickness $T_{306a}$ of the insulating layer 306a may be substantially identical with the thickness $T_{206a}$ of the insulating layer 206a (as shown in FIG. 4A). Alternatively, the thicknesses $T_{306c}$, $T_{306b}$, $T_{306a}$ may be greater than, identical with or less than the thicknesses $T_{206c}$, $T_{206b}$ and the thickness $T_{206a}$ (as shown in FIG. 4A), respectively, as long as the total thickness of the insulating layers 306a, 306b, 306c is greater than the total thickness of the insulating layers 206a, 206b, 206c.

Figure 4G:
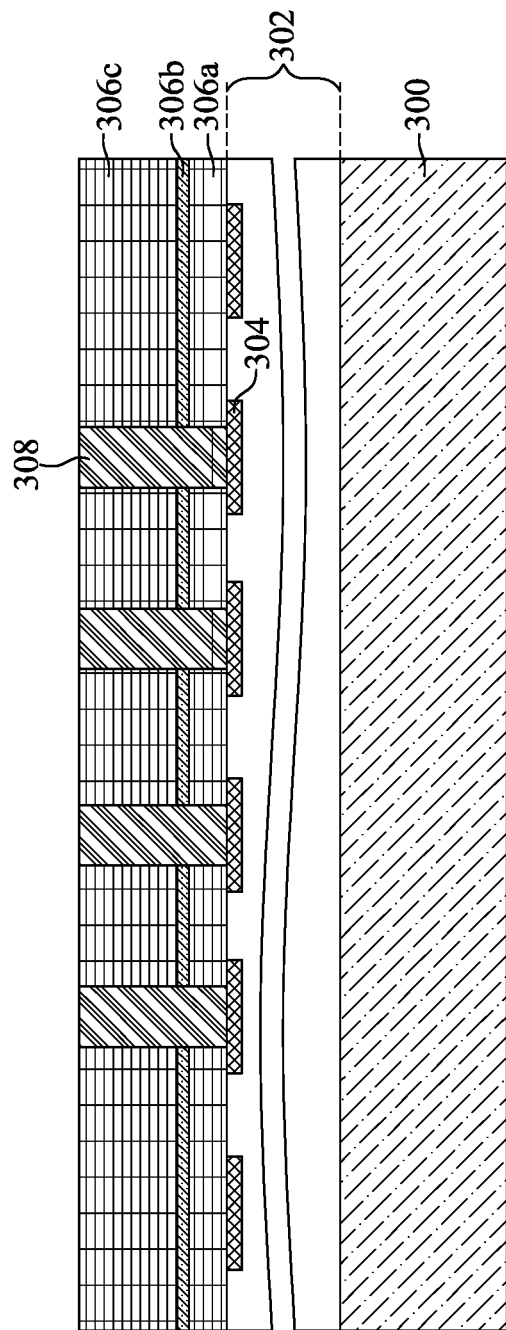

Referring to FIG. 3 and FIG. 4G, step S45 is performed, and the bonding structures 308 are formed in the insulating layers 306a, 306b, 306c. The bonding structures 308 penetrate through the insulating layers 306a, 306b, 306c, and are in contact with some of the topmost portions of the interconnections in the integrated circuit 302 (i.e., the interconnections 304). In some embodiments, the bonding structures 308 are positioned in corresponding to the through holes TH2 of the semiconductor structure 40 as shown in FIG. 4E, and respectively have a width substantially identical with a width of each through hole TH2. In such embodiments, the bonding structures 308 can be inserted into and fill up the through holes TH2 in the following steps (as shown in FIG. 4J). As similar to the supporting structures 210 as described with reference to FIG. 4C, in some embodiments, each of the bonding structures 308 includes a conductive material and a barrier layer covering a sidewall (or a sidewall and a bottom surface) of the conductive material. Alternatively, the barrier layers may be omitted.

Figure 4H:
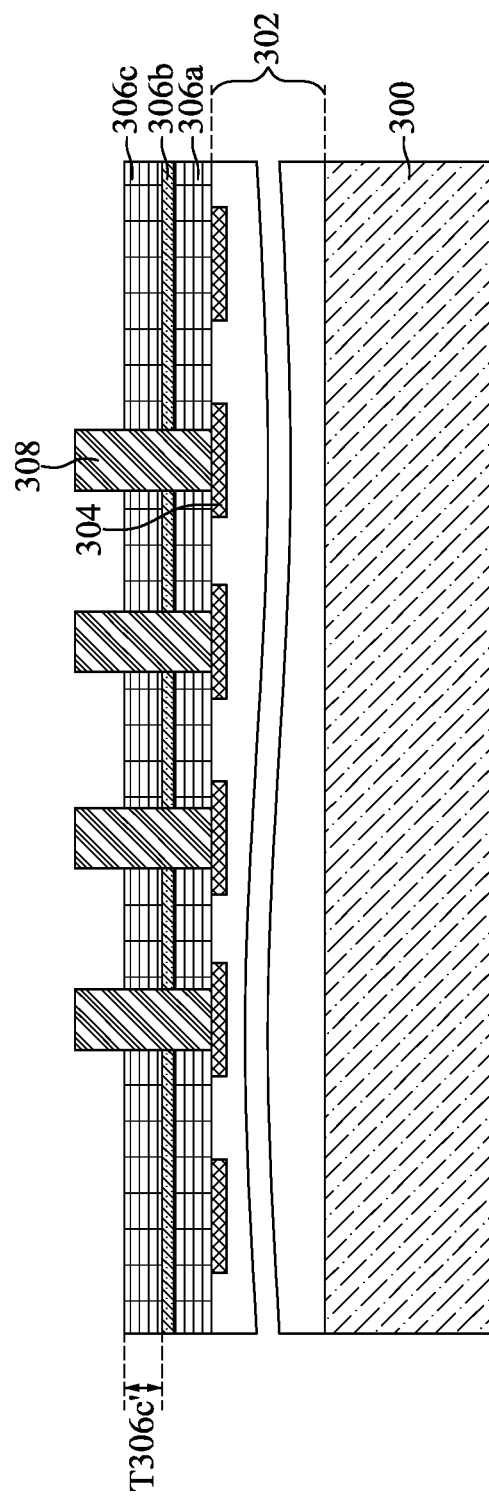

Referring to FIG. 3 and FIG. 4H, step S47 is performed, and the insulating layer 306c is thinned. As a result, the bonding structures 308 protrude from the thinned insulating layer 306c. In some embodiments, the insulating layer 306c is thinned to a thickness $T_{306c}'$ substantially equal to the height by which the supporting structures 210 protrude from the insulating layer 206b (i.e., the thickness $T_{206c}$, as described with reference to FIG. 4D). In these embodiments, after removing a portion of the thinned insulating layer 306c (as to be described with reference to FIG. 4I), the supporting structures 210 and the insulating layer 206b as shown in FIG. 4E can be simultaneously bonded on the insulating layer 306b and the remained portion of the insulating layer 306c (as to be described with reference to FIG. 4J). A method for thinning the insulating layer 306c may include, for example, an etch back process.

Figure 4I:
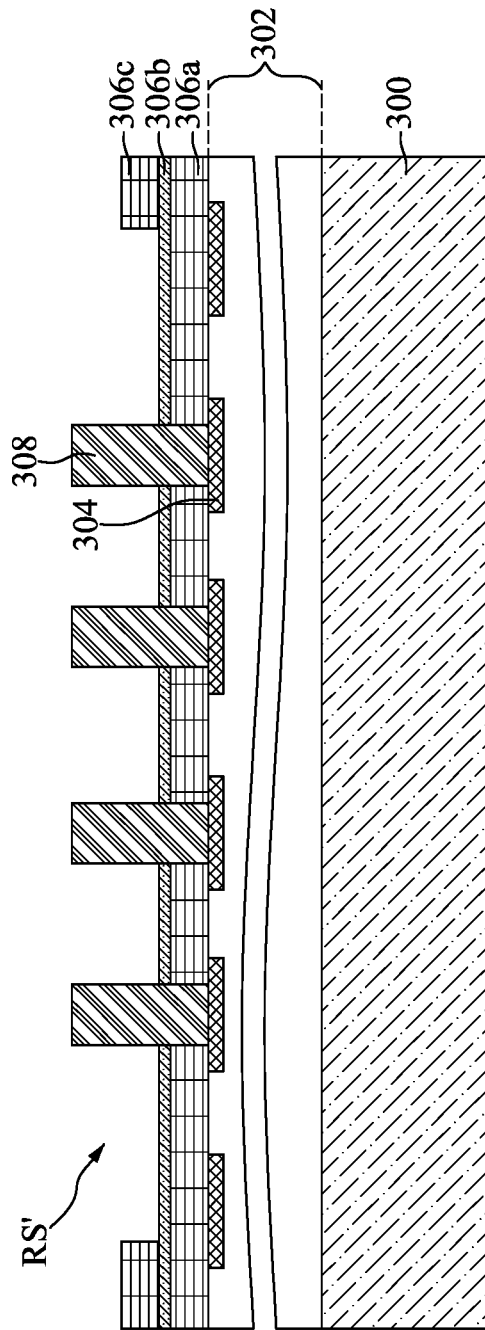
Figure 4J:
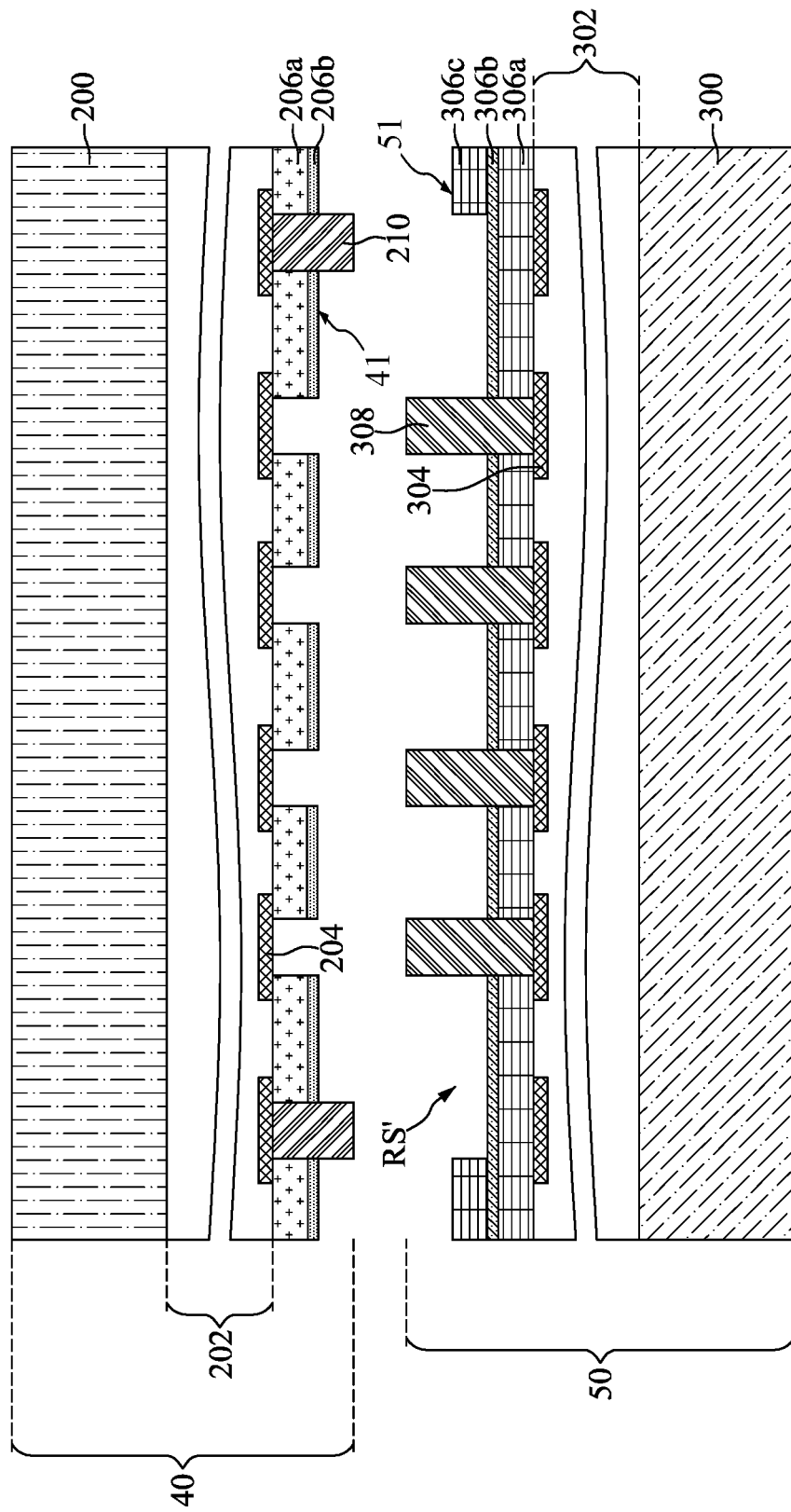

Referring to FIG. 3 and FIG. 4I, step S49 is performed, and a portion of the insulating layer 306c is removed. A recess RS' defined by the remained portion of the insulating layer 306c and an exposed portion of the insulating layer 306b is formed. In some embodiments, the portion of the insulating layer 306c being removed previously surrounds the bonding structures 308, and a height of exposed portions of the bonding structures 308 is increased after removal of the portion of the insulating layer 306c. The height of the exposed portions of the bonding structures 308 is substantially equal to a height of the supporting structures 210 as shown in FIG. 4E, and a height of the buried portions of the bonding structures 308 is substantially equal to a total thickness of the insulating layers 306a, 306b. In this way, when the supporting structures 210 of the semiconductor structure 40 are bonded onto the exposed surface of the insulating layer 306b, the bonding structures 308 may insert into the through holes TH1 and just reach to the interconnections 204, as shown in FIG. 4J. On the other hand, the remained portion of the insulating layer 306c may be laterally spaced apart from the bonding structures 308. In some embodiments, the remained portion of the insulating layer 306c laterally encloses the bonding structures 308, and is in a ring shape. A method for removing the portion of the insulating layer 306c may include a lithography process and an etching process (e.g., an anisotropic etching process).

Up to here, a semiconductor structure 50 has been formed. The semiconductor structure 50 may stay in a wafer form. Alternatively, a singulation process may be further performed, and the semiconductor structure 50, which may be one of the singulated structures, is in a chip form. The semiconductor structure 50 is to be bonded with the semiconductor 40 as shown in FIG. 4J. Exposed surfaces of the insulating layer 306c, the insulating layer 306b and the bonding structures 308 may collectively define a bonding surface 51 of the semiconductor structure 50. At least a portion of the bonding surface of the semiconductor structure 50 may not in contact with the bonding surface of the semiconductor structure 40, as to be described in the following step.

Figure 4K:
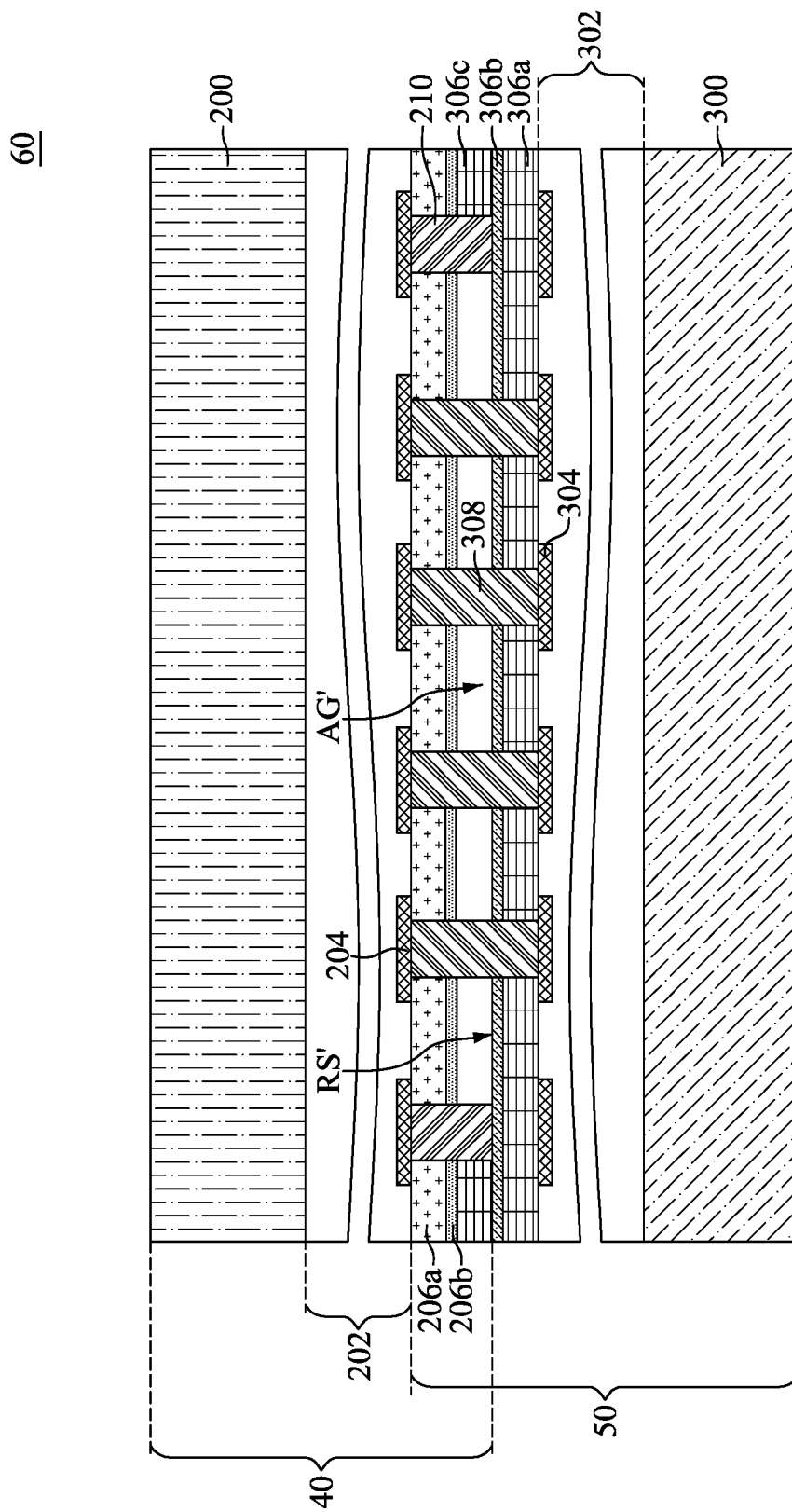

Referring to FIG. 3 and FIGS. 4J-4K, step S51 is performed, and the semiconductor structure 40 shown in FIG. 4E is flipped over and bonded onto the semiconductor structure 50. A portion of the insulating layer 206b of the semiconductor structure 40 is bonded on the insulating layer 306c of the semiconductor structure 50, while the supporting structures 210 of the semiconductor structure 40 may be bonded on the exposed surface of the insulating layer 306b, and may or may not be in lateral contact with the insulating layer 306c. In addition, the through holes TH1 of the semiconductor structure 40 are inserted with the bonding structures 308 of the semiconductor structure 50, and top surfaces of the bonding structures 308 of the semiconductor structure 50 are in contact with the interconnections 204 overlapped with the through holes TH1. Since the height by which the portions of the supporting structures 210 protrude from the insulating layer 206b is substantially equal to the thickness of the insulating layer 306c, the supporting structures 210 may just reach the exposed surface of the insulating layer 306b. In addition, since the height by which the bonding structures 308 protrude from the insulating layer 306b is substantially equal to the summation of the thicknesses of the insulating layers 306b, 206b, 206a, the bonding structures 308 may just reach the previously exposed surfaces of the interconnections 204. Moreover, since a portion of the insulating layer 306c of the semiconductor structure 50 has been removed (as described with reference to FIG. 4I) before the bonding process, the insulating layer 206b of the semiconductor structure 40 may not be entirely in contact with the insulating layer 306c of the semiconductor structure 50. A portion of the insulating layer 206b of the semiconductor structure 40 may not be in contact with the semiconductor structure 50 along a vertical direction. A space between the insulating layer 206b of the semiconductor structure 40 and the insulating layer 306b of the semiconductor structure 50 may be laterally enclosed by the insulating layer 306c, and is sealed in the bonded structure to form an air gap AG'. The bonding structures 308 are laterally surrounded by the air gap AG'. In addition, a region of the air gap AG' may spread between the bonding structures 308 and the supporting structures 210.

The structure including the bonded semiconductor structures 40, 50 may be referred as a semiconductor package 60. In some embodiments, the semiconductor package 60 may be further subjected to other packaging process(es) and/or testing procedures.

As above, the semiconductor package according to embodiments of the present disclosure includes two semiconductor structures bonded with each other, and includes air gaps sealed at an interface between the semiconductor structures. Some of the air gaps are located between conductive components configured to establish electrical connection between the semiconductor structures. Because of a low dielectric constant of air, a capacitive coupling between these conductive components can be reduced by disposing the air gaps in between. Consequently, RC delay of the conductive components can be lowered. Therefore, signal transmission between the semiconductor structures can be improved.

In an aspect of the present disclosure, a semiconductor package is provided. The semiconductor package comprises: a first semiconductor structure, having a first surface and first recesses recessed from the first surface; and a second semiconductor structure, having a second surface and second recesses recessed from the second surface, wherein the first and second semiconductor structures are bonded with each other, the first surface is in contact with the second surface, each of the first recesses and one of the second recesses are overlapped with each other, and combine to form an air gap sealed in the semiconductor package.

In another aspect of the present disclosure, a semiconductor package is provided. The semiconductor package comprises: a first semiconductor structure, having a first surface and a first recess recessed from the first surface, and comprising first conductive structures protruding from a bottom surface of the first recess; and a second semiconductor structure, having a second surface and second recesses recessed from the second surface, and comprising second conductive structures protruding from the second surface, wherein the second semiconductor structure is bonded onto the first semiconductor structure, the first conductive structures insert into the second recesses, the second conductive structures are in contact with the bottom surface of the first recess, a portion of the second surface is in contact with the first surface to seal the first recess, so as to form an air gap in the semiconductor package.

In yet another aspect of the present disclosure, a semiconductor package is provided. The semiconductor package comprises: a first semiconductor structure, having a first bonding surface; a second semiconductor structure, having a second bonding surface, and bonded to the first semiconductor structure, wherein the first bonding surface is partially in contact with the second bonding surface, a portion of the first bonding surface is separated from a portion of the second bonding surface, a space between the portions of the first and second bonding surfaces is sealed and forms an air gap in the semiconductor package.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A semiconductor package, comprising:
a first semiconductor structure, having a first surface and first recesses from the first surface; and
a second semiconductor structure, having a second surface and second recesses from the second surface, wherein the first and second semiconductor structures are bonded with each other, the first surface is in contact with the second surface, each of the first recesses and one of the second recesses are overlapped with each other, and combine to form an air gap sealed in the semiconductor package;
wherein the first surface is a surface of a first insulating structure, the first recesses are recessed into the first insulating structure, the second surface is a surface of a second insulating structure, and the second recesses are recessed into the second insulating structure.

2. The semiconductor package according to claim 1, wherein the first semiconductor structure comprises first conductive structures having surfaces substantially coplanar with the first surface, the second semiconductor structure comprises second conductive structures having surfaces substantially coplanar with the second surface, and the first conductive structures are in contact with the second conductive structures, respectively.

3. The semiconductor package according to claim 2, wherein one of the air gaps is located between adjacent ones of the first conductive structures, and between adjacent ones of the second conductive structures.

4. The semiconductor package according to claim 1, wherein the first recesses are substantially identical with the second recesses in terms of shape and dimension.

5. The semiconductor package according to claim 1, wherein the first semiconductor structure comprises first passivation layers conformally covering surfaces of the first recesses, and the second semiconductor structure comprises second passivation layers conformally covering surfaces of the second recesses.

6. The semiconductor package according to claim 5, wherein the air gaps are respectively enclosed by one of the first passivation layers and one of the second passivation layers.

\* \* \* \* \*